(12) United States Patent
Horak et al.

(10) Patent No.: US 9,064,801 B1
(45) Date of Patent: Jun. 23, 2015

(54) BI-LAYER GATE CAP FOR SELF-ALIGNED CONTACT FORMATION

(71) Applicants: International Business Machines Corporation, Armonk, NY (US); GLOBALFOUNDRIES Inc., Grand Cayman (KY); Samsung Electronics Co., Ltd., Suwon-si (KR)

(72) Inventors: David V. Horak, Essex Junction, VT (US); Jin Wook Lee, Seoul (KR); Daniel Pham, Clifton Park, NY (US); Shom S. Ponoth, Los Angeles, CA (US); Balasubramanian Pranatharthiharan, Watervliet, NY (US)

(73) Assignees: INTERNATIONAL BUSINESS MACHINES CORPORATION, Armonk, NY (US); GLOBALFOUNDRIES, INC., Grand Cayman (KY); SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/161,721

(22) Filed: Jan. 23, 2014

(51) Int. Cl.
| H01L 21/336 | (2006.01) |
| H01L 21/28 | (2006.01) |
| H01L 29/51 | (2006.01) |
| H01L 21/283 | (2006.01) |

(52) U.S. Cl.
CPC ........ *H01L 21/28008* (2013.01); *H01L 29/517* (2013.01); *H01L 29/51* (2013.01); *H01L 21/283* (2013.01)

(58) Field of Classification Search
None
See application file for complete search history.

(56) References Cited

U.S. PATENT DOCUMENTS

| 5,482,894 | A | 1/1996 | Havemann |
| 6,025,255 | A | 2/2000 | Chen et al. |
| 6,291,355 | B1 | 9/2001 | Liu et al. |
| 6,337,285 | B1 | 1/2002 | Ko |
| 7,329,610 | B2 | 2/2008 | Tsuchiya |
| 7,622,331 | B2 | 11/2009 | Shin |
| 7,745,282 | B2 | 6/2010 | Yang et al. |
| 8,153,523 | B2 | 4/2012 | Chen et al. |
| 2010/0078736 | A1* | 4/2010 | Hoentschel et al. .......... 257/408 |
| 2014/0197468 | A1* | 7/2014 | Xie et al. ...................... 257/288 |

FOREIGN PATENT DOCUMENTS

| GB | 2338596 A | 12/1999 |
| GB | 2338596 B | 8/2001 |

* cited by examiner

*Primary Examiner* — Kyoung Lee
(74) *Attorney, Agent, or Firm* — L. Jeffrey Kelly; Yuanmin Cai

(57) ABSTRACT

A method of forming a semiconductor structure includes forming a metal gate above a semiconductor substrate and gate spacers adjacent to the metal gate surrounded by an interlevel dielectric (ILD) layer. The gate spacers and the metal gate are recessed until a height of the metal gate is less than a height of the gate spacers. An etch stop liner is deposited above the gate spacers and the metal gate. A gate cap is deposited above the etch stop liner to form a bi-layer gate cap. A contact hole is formed in the ILD layer adjacent to the metal gate, the etch stop liner in the bi-layer gate cap prevents damage of the gate spacers during formation of the contact hole. A conductive material is deposited in the contact hole to form a contact to a source-drain region in the semiconductor substrate.

17 Claims, 13 Drawing Sheets

BI-LAYER GATE CAP FOR SELF-ALIGNED CONTACT FORMATION

BACKGROUND

The present invention generally relates to integrated circuits, and more particularly to fabricating semiconductor structures having self-aligned contacts.

Contacts may be formed in order to make electrical connections to a semiconductor device. Contacts to a source region or a drain region (referred to collectively as "source-drain regions") of the semiconductor device may be referred to as CA contacts. CA contacts may be distinguished from CB contacts which may form an electrical connection to the gate of a semiconductor structure. In some cases, the source-drain regions must remain electrically isolated from the gate terminal in order to maintain functionality of the semiconductor device. In such situations, a short circuit between the source-drain regions and the gate may damage the semiconductor device.

A CA contact may be formed in a contact hole etched in an interlevel dielectric (ILD) layer deposited over the semiconductor device, and therefore may be surrounded by the ILD layer. As a result of device scaling, self-alignment techniques are becoming widely used to relax alignment requirements and improve control of critical dimensions. A self-alignment technique commonly used may include a self-aligned contact (SAC) etch, in which a pair of adjacent gates may be used to align a recess created in the ILD layer.

SUMMARY

The ability to manufacture semiconductor structures including a bi-layer gate cap to improve self-aligned contact formation may facilitate advancing the capabilities of current complementary metal-oxide-semiconductor (CMOS) technology.

According to an embodiment of the present disclosure, a method of forming a semiconductor structure may include: forming a metal gate above a semiconductor substrate and gate spacers adjacent to the metal gate, the metal gate and the gate spacers may be surrounded by an interlevel dielectric (ILD) layer. The gate spacers and the metal gate may be recessed until a height of the metal gate is less than a height of the gate spacers. An etch stop liner may be deposited above the gate spacers and the metal gate. A gate cap may be deposited above the etch stop liner to form a bi-layer gate cap, the bi-layer gate cap may include the gate cap and the etch stop liner. A contact hole may be formed in the ILD layer adjacent to the metal gate, the etch stop liner may prevent damage of the gate spacers during formation of the contact hole and a conductive material may be deposited in the contact hole to form a contact to a source-drain region in the semiconductor substrate.

According to another embodiment of the present disclosure, a method of forming a semiconductor structure may include: forming a metal gate above a semiconductor substrate, a source-drain region in the semiconductor substrate and gate spacers located on opposite sides of the metal gate. A first ILD layer may be deposited above the semiconductor substrate; the first ILD layer may surround the metal gate. The gate spacers and the metal gate may be etched until a height of the metal gate becomes less than a height of the gate spacers, the etching of the metal gate may form a recess above the metal gate and between the gate spacers. An etch stop liner may be conformally deposited in the recess on top of the metal gate and on top of the gate spacers. A gate cap may be deposited above the etch stop liner. A second ILD layer may be deposited above the first ILD layer and above the gate cap. The first and second ILD layers may be etched to form a contact hole to the source-drain region and a conductive material may be deposited in the contact hole to form a contact electrically connected to the source-drain region.

According to another embodiment of the present disclosure, a semiconductor structure may include: gate spacers located on opposite sides of a metal gate on a semiconductor substrate, a height of the gate spacers may be greater than a height of the metal gate, an ILD layer above the semiconductor substrate, a bi-layer gate cap comprising: an etch stop liner above the gate spacers and the metal gate between opposite sidewalls of the ILD layer; and a gate cap above the etch stop liner and a contact electrically connected to a source-drain region in the semiconductor substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring of the presented embodiments.

As semiconductor devices shrink in each generation of semiconductor technology, formation of CA contacts may become more challenging because there is an increased risk of a short circuit between a metal gate and the CA contact. The risk of a short circuit may be increased because the metal gate and the CA contact may only be separated by a gate spacer which may be susceptible to damage during etching of a contact hole.

A method of forming a semiconductor structure including a bi-layer gate cap to improve self-aligned contact (SAC) formation is described in detail below by referring to the accompanying drawings in FIGS. 1-13, in accordance with an illustrative embodiment of the present disclosure. In typical SAC techniques, a gate cap may be needed to enable the SAC process. The gate cap may include different types of nitrides which may have similar etch properties as a gate spacer. Owing to the similar etch properties; the gate cap and gate spacers may get vertically eroded during a borderless reactive ion etching (RIE) technique used to form the contact hole. The degree of erosion in the gate cap and gate spacers during borderless RIE may depend on the extent of CA contact overlapping the gate spacer. Furthermore, vertical erosion of the gate spacers may increase vertical loss in the CA contact. Accordingly, improving SAC formation may enhance device performance and increase product yield and reliability.

According to an exemplary embodiment, SAC formation may be improved by forming an etch stop liner prior to deposition of the gate cap to form a bi-layer gate cap. The etch stop liner may be conformally deposited on top of a recessed gate and of recessed gate spacers to prevent vertical erosion of the gate cap and gate spacers during formation of the contact hole. One embodiment by which to fabricate the bi-layer gate cap to prevent vertical erosion of gate cap and gate spacers during SAC formation is described in detail below by referring to the accompanying drawings in FIGS. 1-9.

Figure 1:
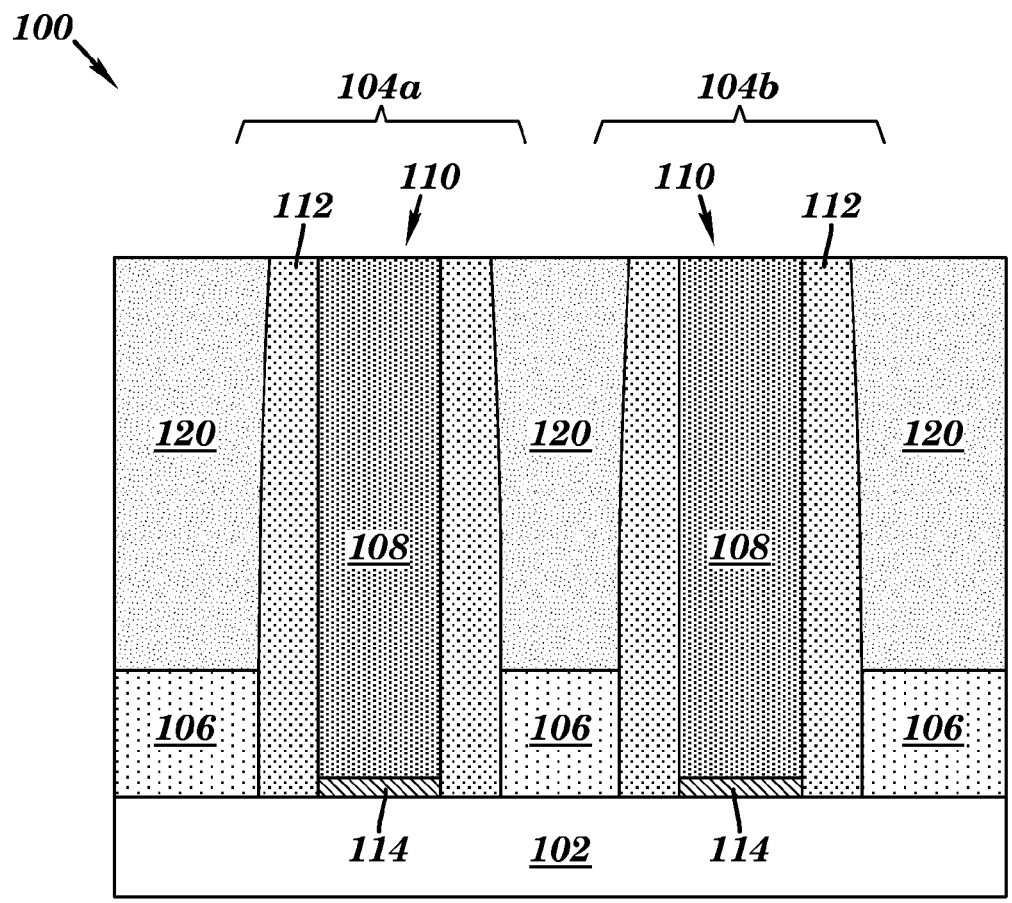
FIG. 1 is a cross-sectional view of a semiconductor structure depicting the formation of at least two adjacent FET devices and a first ILD layer above a semiconductor substrate, according to an embodiment of the present disclosure.

Referring to FIG. 1, a cross-sectional view of a semiconductor structure 100 is shown. At this point of the manufacturing process, the semiconductor structure 100 may include at least two adjacent FET devices 104a, 104b formed over a semiconductor substrate 102. The FET devices 104a, 104b may each include a gate structure 110. The gate structures 110 of the two adjacent FET devices 104a, 104b may be separated from one another by a first interlevel dielectric (ILD) layer 120. The two adjacent FET devices 104a, 104b may each include an n-FET device or a p-FET device, respectively. It should be noted that any number of FET devices may be fabricated in the semiconductor substrate 102 and that the FET devices 104a, 104b may include a planar FET, a FinFET or a nanowire FET.

In this embodiment, the gate structure 110 may be formed above the semiconductor substrate 102. It should be noted that the gate structure 110 may be formed in any semiconductor substrate known to a person having ordinary skill in the art, including but not limited to SOI substrates and bulk silicon substrates. At this point of the manufacturing process, the gate structure 110 may include a gate dielectric 114 and a metal gate 108. In some embodiments, the gate structure 110 may include additional layers (not shown), for example, a workfunction metal. The gate dielectric 114 may include an insulating material including, but not limited to: oxide, nitride, oxynitride or silicate including metal silicates and nitrided metal silicates. In one embodiment, the gate dielectric 114 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 114 may vary, but typically may have a thickness ranging from approximately 0.5 nm to approximately 10 nm. More preferably the gate dielectric 114 may have a thickness ranging from approximately 0.5 nm to approximately 3 nm. The gate dielectric 114 may be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The metal gate 108 may include, for example, Zr, W, Ta, Hf, Ti, Al, Ru, Pa, metal oxide, metal carbide, metal nitride, transition metal aluminides (e.g. $Ti_3Al$, ZrAl), TaC, TiC, TaMgC, TiAlC, TaAlC), and any combination of those materials. In one embodiment, the metal gate 108 may include tungsten (W). The metal gate 108 may be deposited by any suitable deposition technique known in the art, for example by ALD, CVD, physical vapor deposition (PVD), molecular beam deposition (MBD), pulsed laser deposition (PLD), or liquid source misted chemical deposition (LSMCD).

Source-drain regions 106 may be formed in the semiconductor substrate 102. For the purposes of this disclosure, source-drain regions 106 formed in the semiconductor substrate may also include source-drain regions 106 formed on or above the semiconductor substrate 102 (not shown). The steps involved in forming the source-drain regions 106 are well known to those skilled in the art. The source-drain regions 106 may include raised source-drain regions, extension regions, halo regions, and deep source-drain regions.

It should be noted that the FET devices 104a, 104b may be fabricated using either a replacement metal gate (RMG) or gate last process flow, or a gate first process flow. A gate last process flow will be relied on for the description provided below.

With continued reference to FIG. 1, gate spacers 112 may be formed on opposite sidewalls of the metal gate 108 by conventional deposition and etching techniques. In various embodiments, the gate spacers 112 may include one or more layers. While the gate spacers 112 are herein described in the plural, the gate spacers 112 may consist of a single spacer surrounding the metal gate 108. The gate spacers 112 may be made from an insulator material such as an oxide, nitride, oxynitride, silicon carbon oxynitride, silicon boron oxynitride, low-k dielectric, or any combination thereof. The gate spacers 112 may have a thickness ranging from approximately 2 nm to approximately 25 nm. In one embodiment, the gate spacers 112 may include silicon nitride and may be formed by depositing a conformal silicon nitride layer over the gate structure 110 and removing unwanted material from the conformal silicon nitride layer using an anisotropic etching process such as, for example, reactive ion etching (RIE) or plasma etching.

With continued reference to FIG. 1, the first ILD layer 120 may be formed above the semiconductor substrate 102. The first ILD layer 120 may fill the gaps between the gate structures 110 and other existing devices within the semiconductor structure 100. The first ILD layer 120 may be formed by any suitable deposition method known in the art, for example, by CVD of a dielectric material. The first ILD layer 120 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. In some embodiments, the first ILD layer 120 may include one or more additional layers (not shown), including for example, a stress liner or a poly-open chemical mechanical polish (POC) liner deposited between the dielectric material and the semiconductor substrate. The first ILD layer 120 may be thinned, for example by a chemical mechanical planarization/polish (CMP) technique, so that a top surface of the first ILD layer 120 may be approximately coplanar with a top surface of the gate structure 110. After CMP, the first ILD layer 120 may have a thickness ranging from approximately 30 nm to approximately 300 nm.

Figure 2:
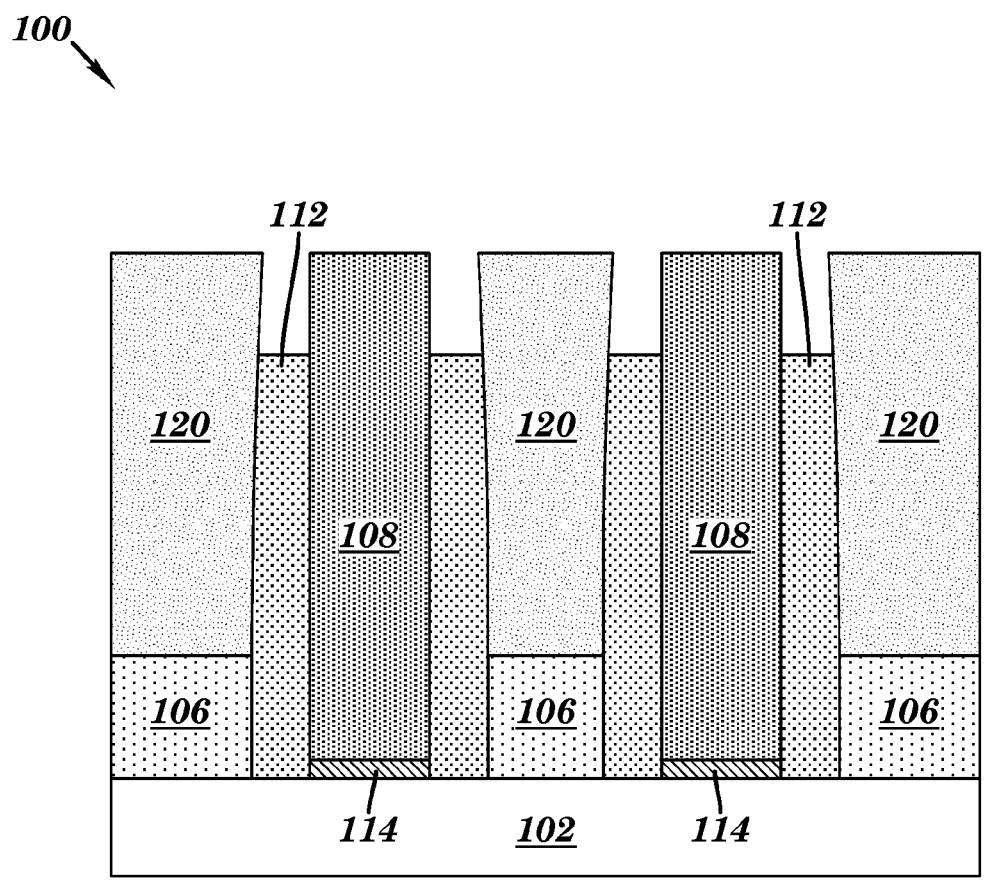
FIG. 2 is a cross-sectional view of a semiconductor structure depicting the recessing of a pair of gate spacers, according to an embodiment of the present disclosure.

Referring now to FIG. 2, the gate spacers 112 may be recessed selective to the first ILD layer 120 and the metal gate 108. The gate spacers 112 may be recessed by any suitable isotropic etching technique known in the art, such as for example, directional reactive ion etching (RIE). Alternately, the gate spacers 112 may be recessed using a wet etch process which may be selective to the metal gate 108 and the first ILD layer 120. After recessing the gate spacers 112 a top portion of the metal gate 108 may be exposed. In one embodiment etching of the gate spacers 112 may stop once a height of approximately 3 nm to approximately 30 nm of the metal gate 108 is exposed.

Figure 3:
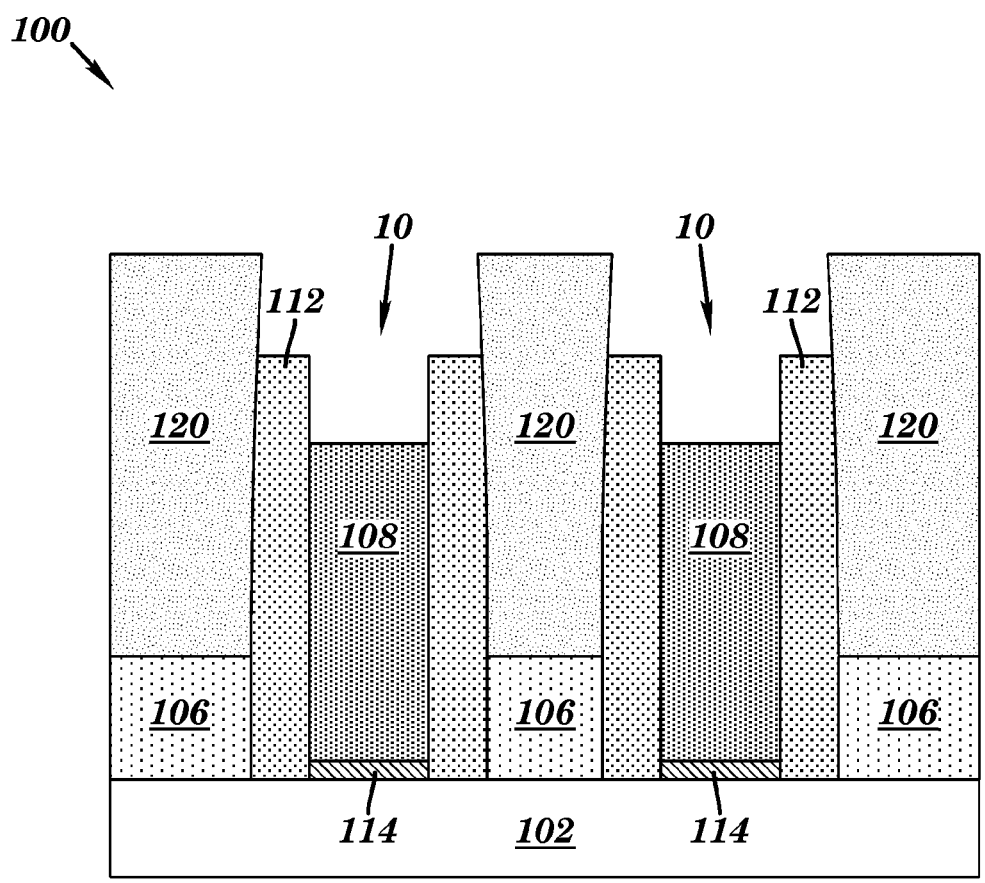
FIG. 3 is a cross-sectional view of a semiconductor structure depicting the recessing of a metal gate located between the pair of gate spacers, according to an embodiment of the present disclosure.

Referring now to FIG. 3, the metal gate 108 may be recessed selective to the gate spacers 112 and the first ILD layer 120 to form a gate recess region 10. Ideal etch selectivity may result in a fast etch rate for the metal gate 108, with little or no etching of all other materials. In some embodiments, some etching of the gate spacers 112 and the first ILD layer 120 may be acceptable. The metal gate 108 may be recessed by any suitable isotropic etching technique known in the art, for example, by directional RIE. The gate may be recessed until a height of the gate spacers 112 is greater than a height of the metal gate 108. In one embodiment, the height of the gate spacers 112 may be greater than the height of the metal gate 108 by approximately 3 nm to approximately 30 nm.

Figure 4:
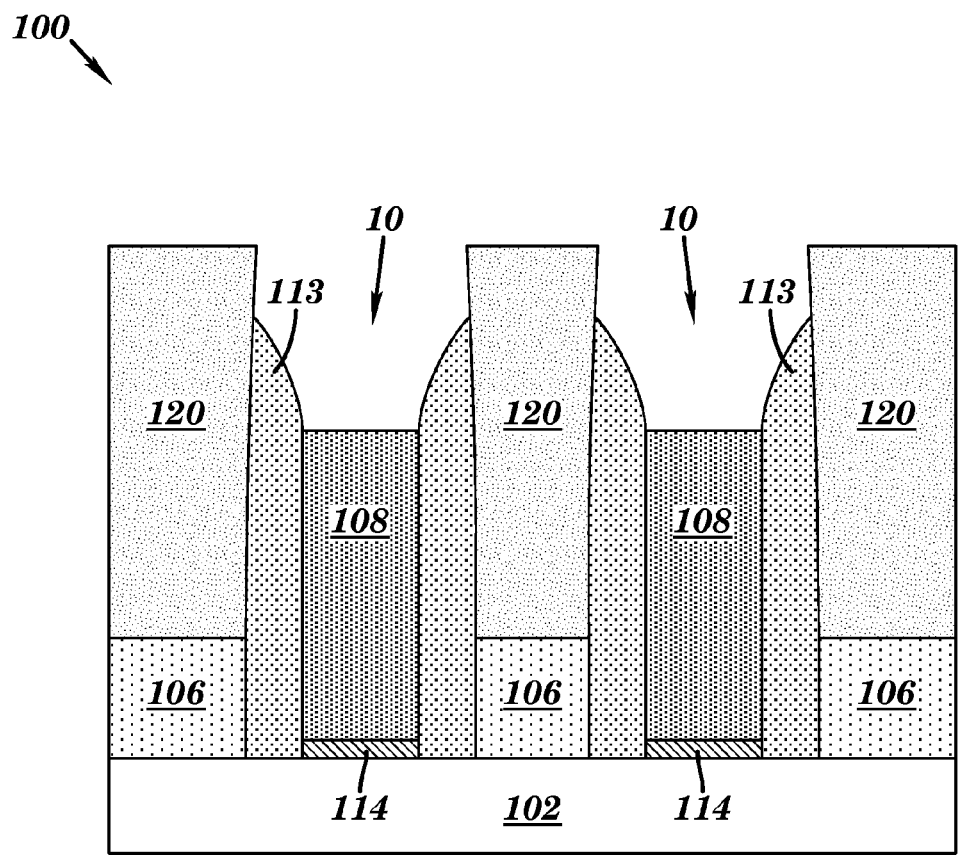
FIG. 4 is a cross-sectional view of a semiconductor structure depicting an alternate sequence for recessing the metal gate and gate spacers, according to an embodiment of the present disclosure.

Referring now to FIG. 4, alternatively, the metal gate 108 may be recessed prior to recessing the gate spacers 112. In this case, both the metal gate 108 and the gate spacers 112 may be recessed by means of any suitable isotropic etching technique known in the art, for example, by directional RIE. Isotropic etch of the metal gate 108 prior to recessing the gate spacers 112 may form rounded spacers 113 on opposite sidewalls of the first ILD layer 120 adjacent to the metal gate 108.

Figure 5:
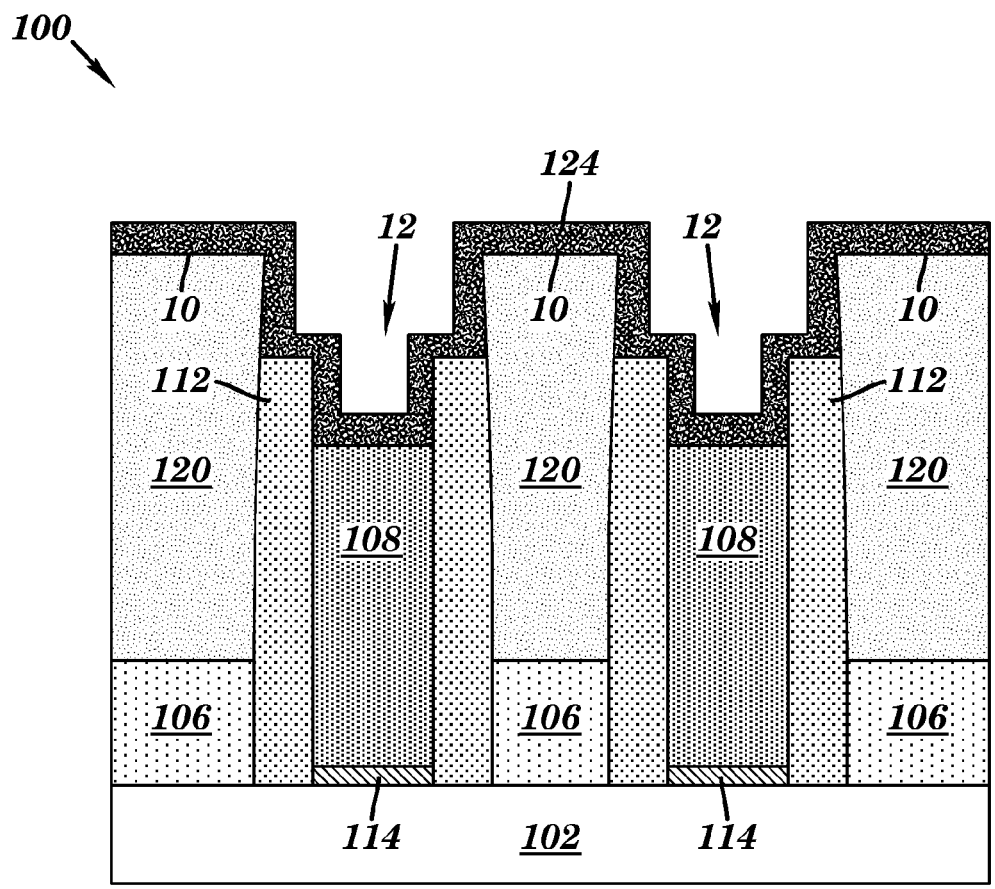
FIG. 5 is a cross-sectional view of a semiconductor structure depicting the deposition of an etch stop liner, according to an embodiment of the present disclosure.

Referring now to FIG. 5, an etch stop liner 124 may be deposited in the gate recess region 10. The etch stop liner 124 may function as a protective liner to prevent damage of a subsequently formed gate cap (FIGS. 6-7) and of the gate spacers 112 during etching of the contact hole 133 (FIG. 8) to form the CA contact 136 (FIG. 9). The etch stop liner 124 may have different etch selectivity than a subsequently formed gate cap 128 (shown in FIG. 7) and than the gate spacers 112 and first ILD layer 120. In one embodiment, the etch stop liner 124 may include a high-k dielectric material including transition metal oxides such as hafnium oxides ($Hf_yO_x$), lanthanum oxides ($La_yO_x$) and zirconium oxides ($Zr_yO_x$). In another embodiment, the high-k material forming the etch stop liner 124 may include silicon-carbide (SiC). The etch stop liner 124 may have a thickness ranging from approximately 1 nm to approximately 10 nm. The etch stop liner 124 may be formed by any deposition method know in the art, for example, by atomic layer deposition (ALD). Deposition of the etch stop liner 124 may delineate an upper contour of the semiconductor structure 100 creating recesses 12 above the metal gate 108, between an upper portion of the gate spacers 112 and the first dielectric layer 120.

Figure 6:
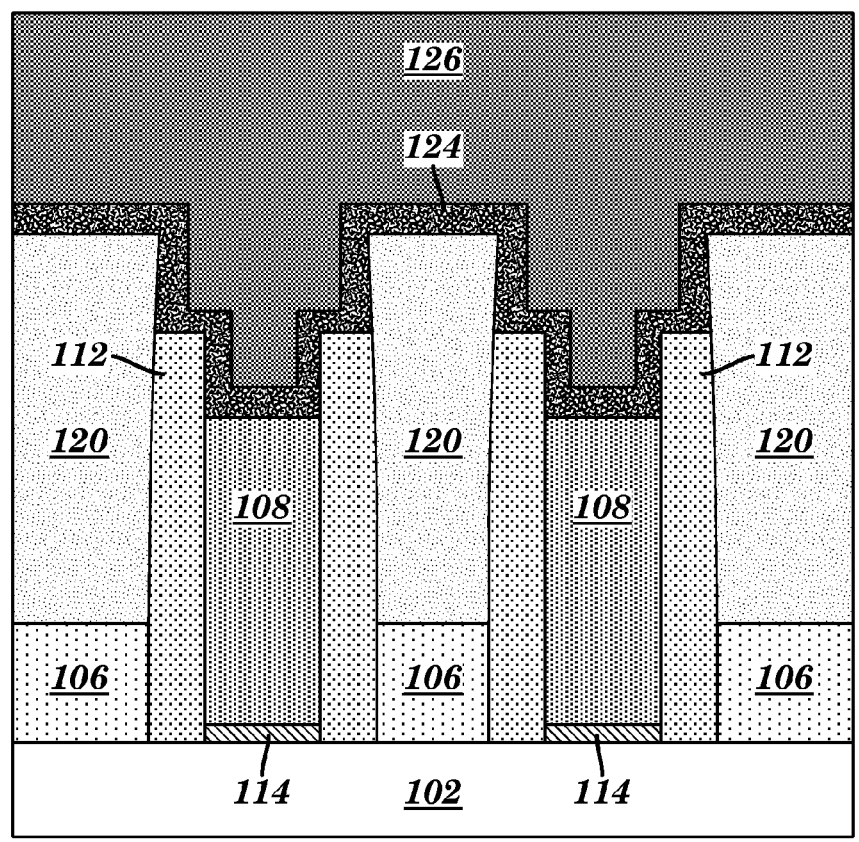
FIG. 6 is a cross-sectional view of a semiconductor structure depicting the deposition of a cap layer above the etch stop liner, according to an embodiment of the present disclosure.
Figure 7:
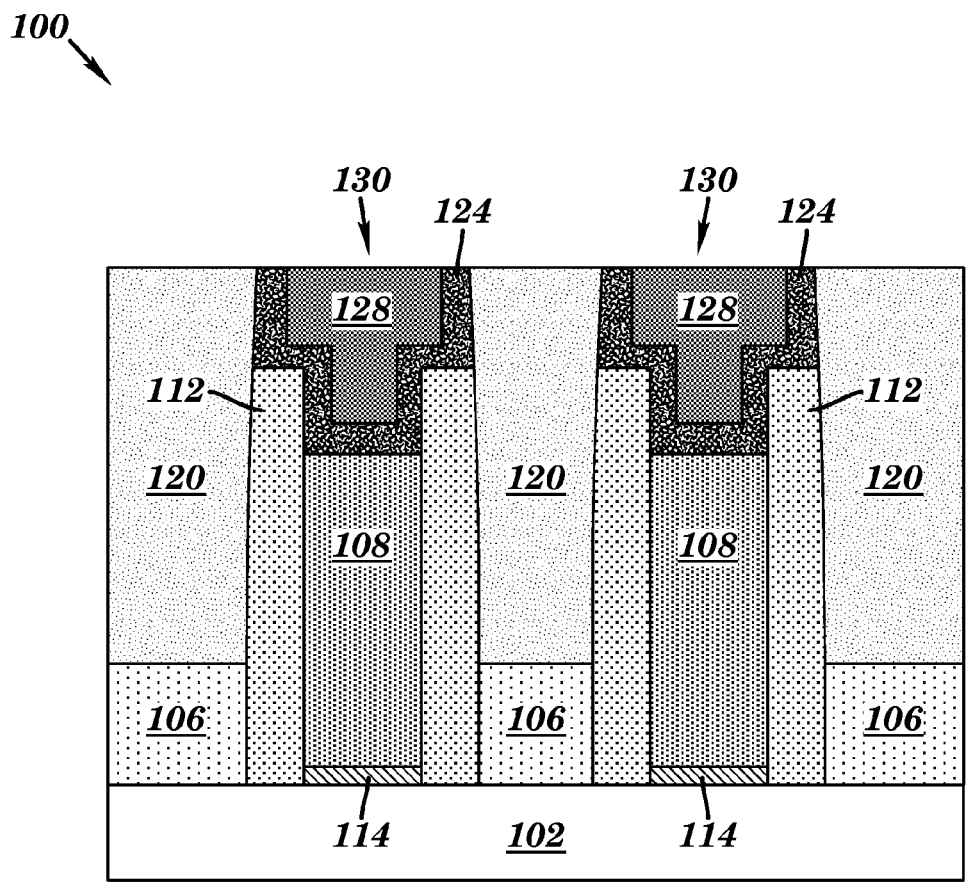
FIG. 7 is a cross-sectional view of a semiconductor structure depicting the formation of a bi-layer gate cap, according to an embodiment of the present disclosure.

Referring now to FIG. 6, a cap layer 126 may be deposited above the etch stop liner 124 to form a gate cap 128 shown in FIG. 7. The cap layer 126 may substantially fill the recesses 12 (FIG. 5). The cap layer 126 may be made of a suitable dielectric material capable of being etched selectively relative to the etch stop liner 124. In some embodiments, the cap layer 126 may be made of substantially the same material as the gate spacers 112. For example, the cap layer 126 may include silicon nitride and may have a thickness ranging from approximately 10 nm to approximately 100 nm. The cap layer 126 may be formed by any deposition method know in the art, for example, by CVD or ALD.

Referring now to FIG. 7, An excess of the cap layer 126 (FIG. 6) and of the etch stop liner 124 (FIG. 6) may be removed from above the semiconductor structure 100, using, for example, a CMP process, such that an upper portion of the cap layer 126 and the etch stop liner 124 may be substantially coplanar with an upper surface of the first ILD layer 120. The remaining portion of the cap layer 126 may form the gate cap 128. Together, the gate cap 128 and the etch stop liner 124 underneath may form a bi-layer gate cap 130 in which the etch stop liner 124 may prevent vertical erosion of the gate cap 128 and gate spacers 112 during subsequent formation of a contact hole 133 shown in FIG. 8.

Figure 8:
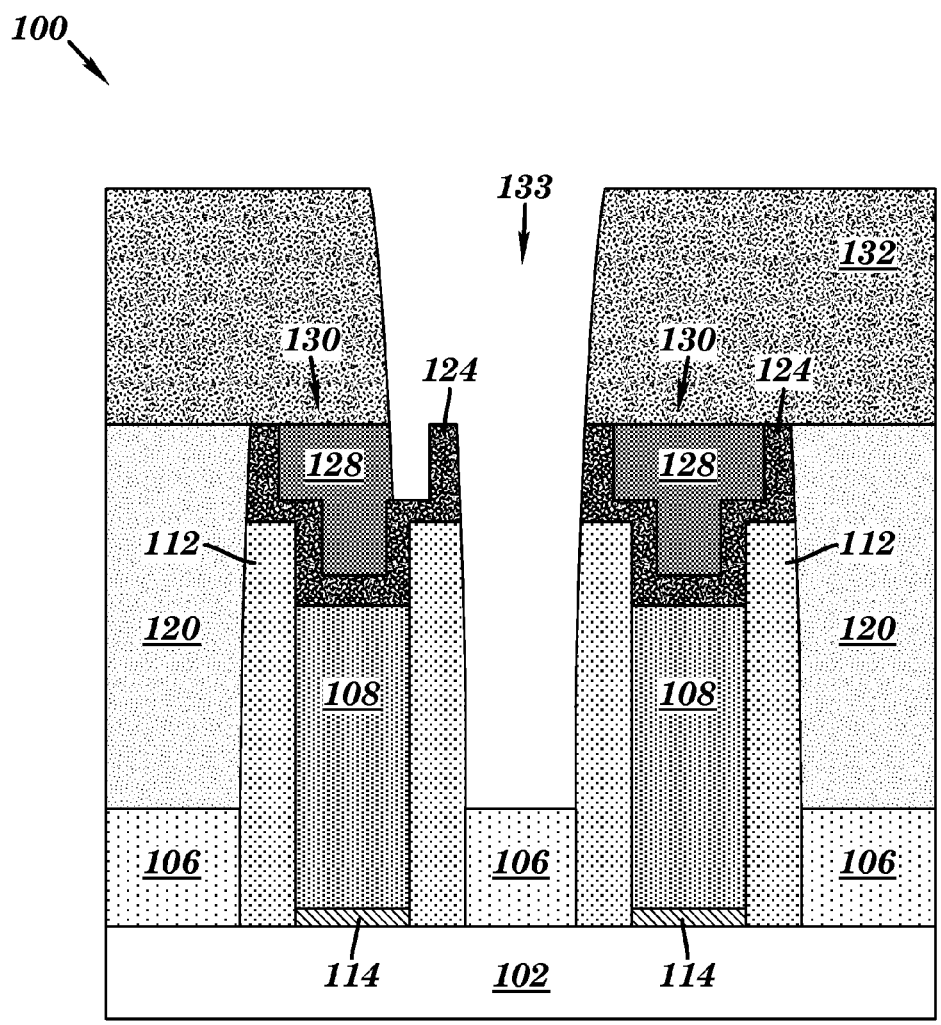
FIG. 8 is a cross-sectional view of a semiconductor structure depicting the deposition of a second ILD layer and the formation of a contact hole, according to an embodiment of the present disclosure.
Figure 9:
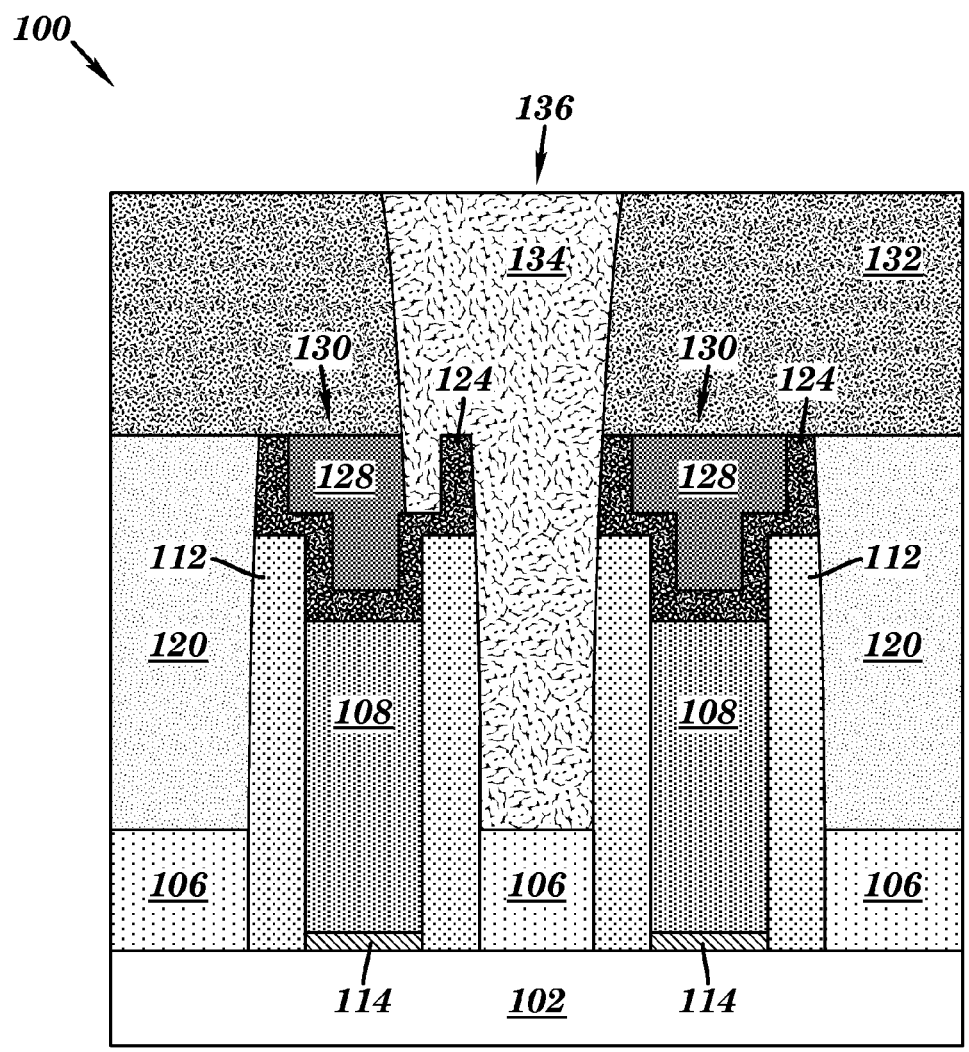
FIG. 9 is a cross-sectional view of a semiconductor structure depicting the formation of a metallized contact to an active source-drain region according to according to an embodiment of the present disclosure.

Referring now to FIG. 8, a second ILD layer 132 may be deposited above the first ILD layer 120 and above the bi-layer gate cap 130 and etched to form a contact hole 133 in the second and first ILD layers 132, 120. The second ILD layer 132 may be formed by any suitable deposition method known in the art, for example, by CVD of a dielectric material. The second ILD layer 132 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The second ILD layer 132 may be made of a substantially similar material as the first ILD layer 120. Accordingly, in some embodiments, the second ILD layer 132 may not be distinguishable from the first ILD layer 120 after deposition.

To form the contact hole 133, a portion of the first and second ILD layers 120, 132 may be removed by any suitable etching technique known in the art including, for example, by dry etch, wet etch, or combination of both. The removal technique may be selective to the etch stop liner 124 and to the gate cap 128. In one embodiment, a RIE technique may be used to etch the contact hole selectively to the etch stop liner 124 and to the gate cap 128. During formation of the contact hole 133, a portion of the gate cap 128 may be removed. However, the etch stop liner 124 may function as a barrier during the removal of the portion of the first and second ILD layers 120, 132 to form the contact hole 133. If the etch stop liner 124 were absent the gate spacers 112 may be damaged by the etching technique used to form the contact hole 133, and therefore a short circuit may be caused between the metal gate 108 and a subsequently formed contact to the source-drain regions 106 formed in the contact hole 133.

Referring now to FIG. 9, a contact (hereinafter "CA contact") 136 may be formed by filling the contact hole 133 with a conductive material 134. The CA contact 136 may be electrically connected to a source-drain region 106. The conductive material may include a material having a high electrical conductivity. In one embodiment, the conductive material 134 may include, for example, tungsten, copper, aluminum, silver, gold, alloys thereof, and any suitable combination thereof. The thickness, or depth, of the conductive material 134 may range from approximately 30 nm to approximately 600 nm, although lesser and greater thicknesses may also be used. The conductive material 134 may be deposited by any suitable deposition technique, such as, for example: ALD, molecular layer deposition (MLD), CVD, in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. After formation of the CA contact 136, a planarization process such as CMP may be performed to remove an excess conductive material 134 from above the semiconductor structure 100 (not shown).

Therefore, forming the etch stop liner 124 prior to forming the gate cap 128 during fabrication of self-aligned contacts may have many advantages, including, but not limited to: the etch stop liner 124 may serve as an effective barrier during etching of the contact hole 133 to form the CA contact 136, preventing vertical erosion of the gate cap 128 and restoring the borderless nature of the etch, this semiconductor structure may enable void free fill of the subsequently deposited cap materials; the etch stop liner 124 may provide additional protection to the gate spacers 112 during etching of the contact hole 133 to form the CA contact 136 since erosion of the gate spacers 112 may also be observed during formation of the CA contact; and because the etch stop liner 124 may not need to be removed, an etching step may be eliminated, thus greatly reducing the possibility of causing further damage to the gate cap 128 and the gate spacers 112.

An alternate embodiment by which to fabricate a bi-layer gate cap to prevent vertical erosion during SAC formation is described in detail below by referring to the accompanying drawings in FIGS. 10-13.

Figure 10:
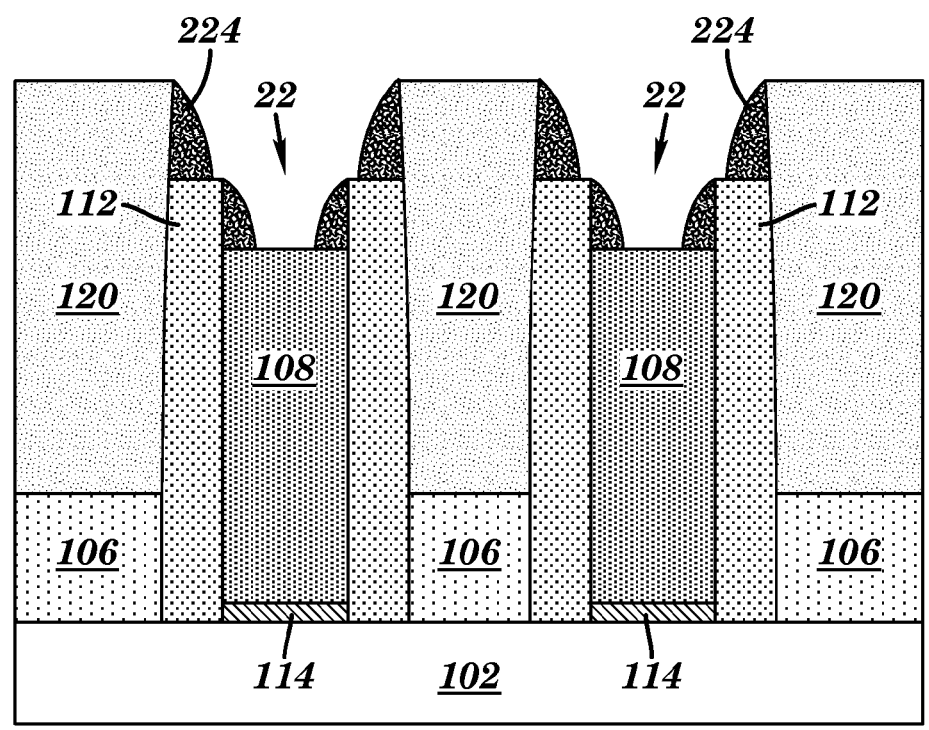
FIG. 10 is a cross-sectional view of a semiconductor structure depicting the formation of etch stop spacers, according to an alternate embodiment of the present disclosure.

Referring now to FIG. 10, alternatively the etch stop liner 124 shown in FIG. 5 may be etched by any suitable dry etching technique known in the art, such as directional RIE, to form a group of rounded spacers 224 (hereinafter "etch stop spacers") located above the gate spacers 112 on opposite sidewalls of the first ILD layer 120 and above the metal gate 108. The etch stop spacers 224 may provide similar advantages during the formation of contact holes as the etch stop liner 124 described above in FIGS. 5-9. However, the etch stop spacers 224 may partially cover an exposed upper portion of the gate spacers 112 and an upper surface of the metal gate 108. The etch stop spacers 224 may have a thickness ranging from approximately 2 nm to approximately 8 nm. Formation of the etch stop spacers 224 may create recesses 22 above the metal gate 108.

Once the etch stop spacers 224 may be formed, the manufacturing process may continue following similar processing steps as the ones described in FIGS. 6-9.

Figure 11:
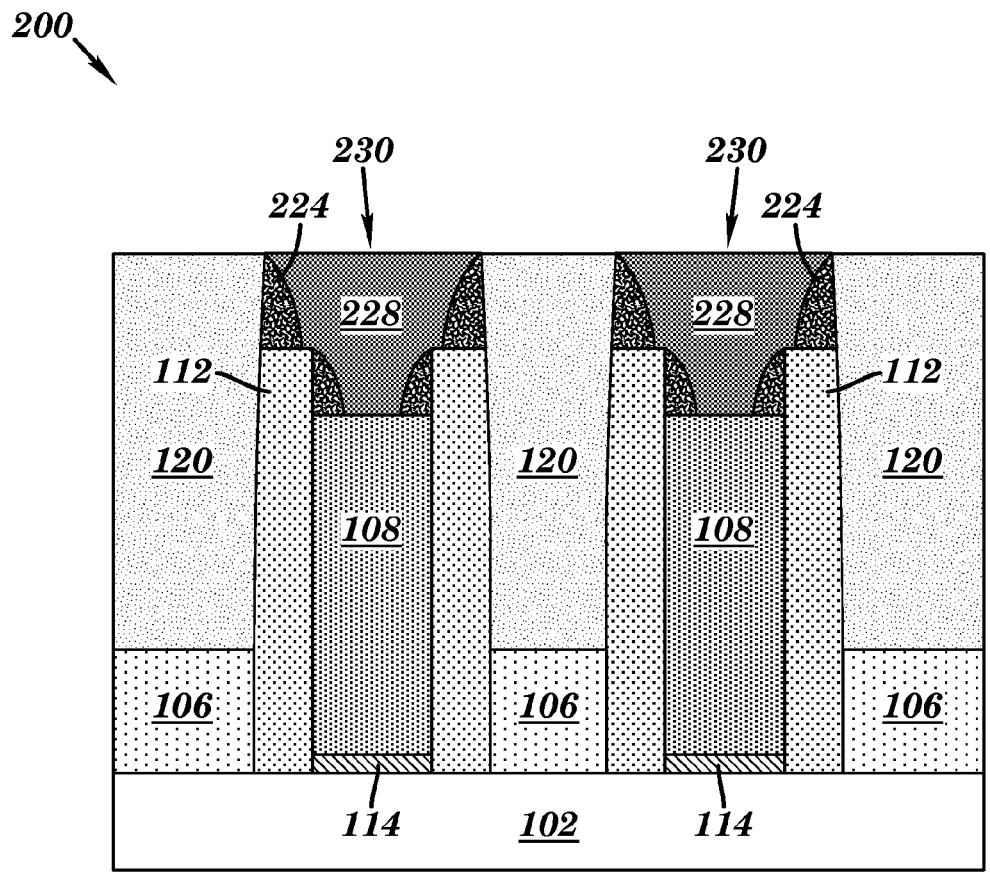
FIG. 11 is a cross-sectional view of a semiconductor structure depicting the formation of a bi-layer gate cap, according to an alternate embodiment of the present disclosure.

Referring now to FIG. 11, a cap material substantially similar to the material of the cap layer 126 shown in FIG. 6 may be deposited in the recesses 22 (FIG. 10) to form a gate cap 228. The gate cap 228 may substantially fill the recesses 22 (FIG. 10). The gate cap 228 may include similar materials and may be formed by similar deposition methods as the cap layer 126 shown in FIG. 6. A CMP process may be conducted to remove an excess of the cap layer (not shown) and etch stop spacers material (not shown) from above the semiconductor structure 100 such that an upper portion of the gate cap 228 and the etch stop spaces 224 may be substantially coplanar with an upper surface of the first ILD layer 120. The gate cap 228 and the etch stop spacers 224 may form a bi-layer gate cap 230 in which the etch stop spacers 224 may prevent vertical erosion of the gate cap 228 and of the gate spacers 112 during subsequent formation of a contact hole 233 (FIG. 12).

Figure 12:
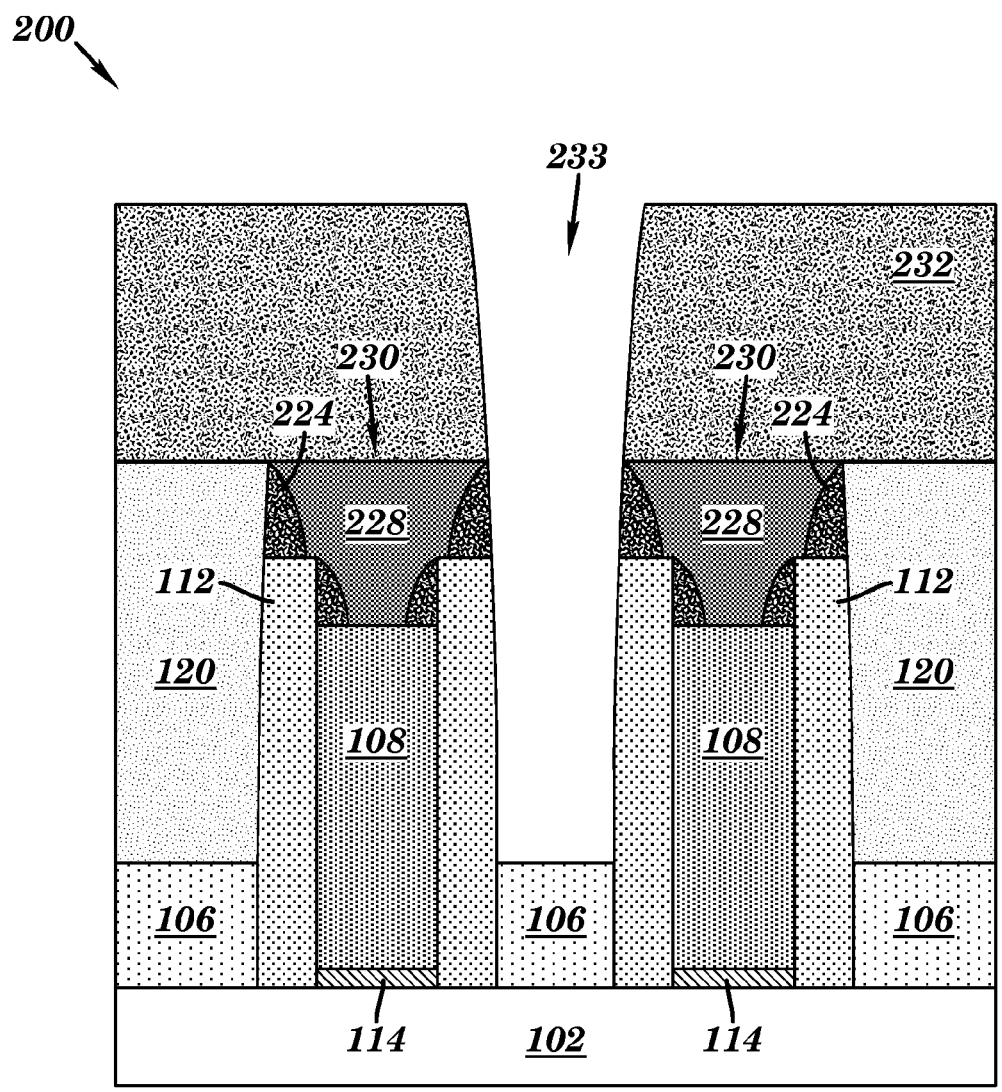
FIG. 12 is a cross-sectional view of a semiconductor structure depicting the deposition of a second ILD layer and the formation of a contact hole, according to an alternate embodiment of the present disclosure.

Referring now to FIG. 12, a second ILD layer 232 may be deposited above the first ILD layer 120 and above the bi-layer gate cap 230 and etched to form a contact hole 233 in the second and first ILD layers 232, 120. The second ILD layer 232 may be formed by any suitable deposition method known in the art, for example, by CVD of a dielectric material. The second ILD layer 232 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The second ILD layer 232 may be made of a substantially similar material as the first ILD layer 120. Accordingly, in some embodiments, the second ILD layer 232 may not be distinguishable from the first ILD layer 120 after deposition.

To form the contact hole 233, a portion of the first and second ILD layers 120, 232 may be removed by any suitable etching technique known in the art including, for example, by dry etch, wet etch, or combination of both. The removal technique may be selective to the etch stop spacers 224 and the gate cap 228. In one embodiment, a RIE technique may be used to etch the contact hole 233 selectively to the etch stop spacers 224 and the gate cap 228. During formation of the contact hole 233, a portion of the gate cap 228 may be removed. However, the etch stop spacers 224 may function as a barrier during formation of the contact hole 233. If the etch stop spacers 224 were absent the gate spacers 112 and the gate cap 228 may be damaged by the etching technique used to form the contact hole 233, and therefore a short circuit may be caused between the metal gate 108 and a subsequently formed contact to the source-drain regions 106 formed in the contact hole 233.

Figure 13:
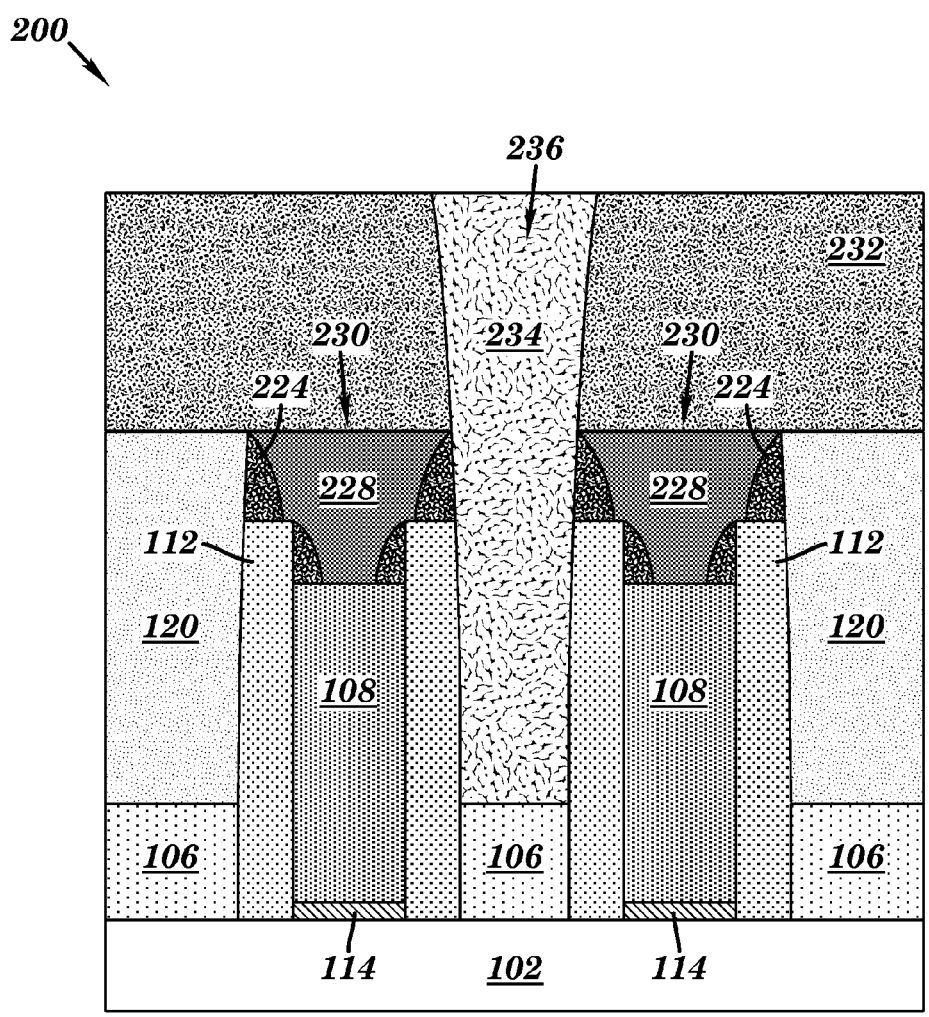
FIG. 13 is a cross-sectional view of a semiconductor structure depicting the formation of a metallized contact to an active source-drain region, according to an alternate embodiment of the present disclosure.

Referring now to FIG. 13, a contact (hereinafter "CA contact") 236 may be formed by filling the contact hole 233 with a conductive material 234. The CA contact 236 may be electrically connected to a source-drain region 106. The conductive material 234 may include a material having a high electrical conductivity. In one embodiment, the conductive material 234 may include, for example, tungsten, copper, aluminum, silver, gold, alloys thereof, and any suitable combination thereof. The thickness, or depth, of the conductive material 234, may range from approximately 30 nm to approximately 600 nm, although lesser and greater thicknesses may also be used. The conductive material 234 may be deposited by any suitable technique, such as, for example: ALD, molecular layer deposition (MLD), CVD, in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. Depending on the contact overlay during lithography, the CA contact 236 may or may not overlap the gate spacers 112 and the gate cap 228. After formation of the CA contact 236, a planarization process such as CMP may be performed to remove an excess conductive material 234 from above the semiconductor structure 200 (not shown).

Therefore, forming the etch stop spacers 224 prior to forming the gate cap 228 during fabrication of CA contacts may many advantages over known techniques in the art, including, but not limited to: the etch stop spacers 224 may serve as an effective barrier during etching of the contact hole 233 to form the CA contact 236, preventing vertical erosion of the gate cap 228 and restoring the borderless nature of the etch, this semiconductor structure may enable void free fill of the subsequently deposited cap materials; the etch stop spacers 224 may provide additional protection to the gate spacers 112 during etching of the contact hole to form the CA contact 236 since erosion of the gate spacers 112 have been observed during formation of CA contacts and because the etch stop spacers 224 may not need to be removed, an etching step may be eliminated, thus greatly reducing the possibility of causing further damage to the gate spacers 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure, the method comprising:
   forming a metal gate above a semiconductor substrate and gate spacers adjacent to the metal gate, wherein the metal gate and the gate spacers are surrounded by an interlevel dielectric (ILD) layer;
   recessing the gate spacers;
   recessing the metal gate until a height of the metal gate is less than a height of the gate spacers;
   depositing an etch stop liner above the gate spacers and the metal gate, wherein the etch stop liner comprises a high-k dielectric material;
   etching the etch stop liner comprising the high-k dielectric material to form etch stop spacers above the gate spacers and above the metal gate;
   depositing a gate cap above the etch stop liner to form a bi-layer gate cap, the bi-layer gate cap comprising the gate cap and the etch stop liner;
   forming a contact hole in the ILD layer adjacent to the metal gate, wherein the etch stop liner prevents damage of the gate spacers during formation of the contact hole; and
   depositing a conductive material in the contact hole to form a contact to a source-drain region in the semiconductor substrate.

2. The method of claim 1, wherein the high-k dielectric material has a high etch selectivity relative to the gate cap and the ILD layer.

3. The method of claim 1, wherein the high-k dielectric material comprises a transition metal oxide, said transition metal oxide being selected from a group consisting of hafnium oxides, lanthanum oxides, and zirconium oxides.

4. The method of claim 1, wherein the high-k dielectric material comprises silicon-carbide (SiC).

5. The method of claim 1, wherein recessing the gate spacers occurs after recessing the metal gate.

6. The method of claim 1, wherein etching the etch stop liner to form etch stop spacers comprises conducting a dry etching technique in the high-k dielectric material.

7. A method of forming a semiconductor structure, the method comprising:
   forming a metal gate above a semiconductor substrate, a source-drain region in the semiconductor substrate and gate spacers located on opposite sides of the metal gate;
   depositing a first ILD layer above the semiconductor substrate, the first ILD layer surrounding the metal gate;
   etching the gate spacers;
   etching the metal gate until a height of the metal gate becomes less than a height of the gate spacers, wherein the etching of the metal gate forms a recess above the metal gate and between the gate spacers;
   conformally depositing an etch stop liner in the recess on top of the metal gate and on top of the gate spacers, wherein the etch stop liner comprises a high-k dielectric material;
   etching the etch stop liner comprising the high-k dielectric material to form etch stop spacers above the gate spacers and on opposite sidewalls of the first ILD layer, wherein the etch stop spacers partially cover the gate spacers and the metal gate;
   depositing a gate cap above the etch stop liner;
   depositing a second ILD layer above the first ILD layer and above the gate cap;
   etching the first and second ILD layers to form a contact hole to the source-drain region; and
   depositing a conductive material in the contact hole to form a contact electrically connected to the source-drain region.

8. The method of claim 7, wherein the high-k dielectric material has a high etch selectivity relative to the gate cap formed on top thereof.

9. The method of claim 7, wherein the high-k dielectric material comprises a transition metal oxide, said transition metal oxide being selected from a group consisting of hafnium oxides, lanthanum oxides, and zirconium oxides.

10. The method of claim 7, wherein the high-k dielectric material comprises silicon-carbide (SiC).

11. The method of claim 7, wherein recessing the gate spacers occurs after recessing the metal gate.

12. The method of claim 7, wherein etching the etch stop liner to form etch top spacers comprises conducting a dry etching technique in the high-k dielectric material.

13. A semiconductor structure, the structure comprising:
   gate spacers located on opposite sides of a metal gate on a semiconductor substrate, a height of the gate spacers being greater than a height of the metal gate;
   an ILD layer above the semiconductor substrate;
   a bi-layer gate cap comprising:
      an etch stop liner above the gate spacers and the metal gate, wherein the etch stop liner comprises a plurality of etch stop spacers on the metal gate and on the gate spacers; and
      a gate cap above the etch stop liner; and
   a contact electrically connected to a source-drain region in the semiconductor substrate.

14. The semiconductor structure of claim 13, wherein the etch stop liner comprises a high-k dielectric material that has high etch selectivity to the gate cap.

15. The method of claim 14, wherein the high-k dielectric material comprises a transition metal oxide selected from the group consisting of hafnium oxides, lanthanum oxides, and zirconium oxides.

16. The method of claim 14, wherein the high-k dielectric material comprises silicon-carbide (SiC).

17. The semiconductor structure of claim 13 wherein the etch stop spacers are rounded and partially cover the gate spacers and the metal gate.

\* \* \* \* \*